(12) United States Patent
Imamura et al.

(10) Patent No.: US 12,270,877 B2
(45) Date of Patent: Apr. 8, 2025

(54) MAGNETIC RESONANCE IMAGING APPARATUS

(71) Applicant: FUJIFILM Healthcare Corporation, Kashiwa (JP)

(72) Inventors: Yukinobu Imamura, Kashiwa (JP); Shinichiro Suzuki, Kashiwa (JP); Hideta Habara, Kashiwa (JP)

(73) Assignee: FUJIFILM Corporation, Tokyo (JP)

( * ) Notice: Subject to any disclaimer, the term of this patent is extended or adjusted under 35 U.S.C. 154(b) by 145 days.

(21) Appl. No.: 18/216,371

(22) Filed: Jun. 29, 2023

(65) Prior Publication Data

US 2024/0077560 A1    Mar. 7, 2024

(30) Foreign Application Priority Data

Sep. 2, 2022    (JP) ................................. 2022-140052

(51) Int. Cl.
     *G01R 33/38*       (2006.01)
     *G01R 33/385*      (2006.01)
     *G01R 33/387*      (2006.01)

(52) U.S. Cl.
     CPC ......... *G01R 33/387* (2013.01); *G01R 33/385* (2013.01)

(58) Field of Classification Search
     CPC .. G01R 33/387; G01R 33/385; G01R 33/422; G01R 33/48; G01R 33/42; A61B 5/055
     See application file for complete search history.

(56) References Cited

U.S. PATENT DOCUMENTS

2015/0212174 A1*    7/2015    Brown ............. G01R 33/56518
                                                                         324/322

FOREIGN PATENT DOCUMENTS

JP       H03-050543 B2    8/1991
JP       2006-116300 A    5/2006

* cited by examiner

*Primary Examiner* — G. M. A Hyder
(74) *Attorney, Agent, or Firm* — Paul Teng

(57) ABSTRACT

To suppress eddy current generation by a gradient magnetic field while an RF shield has a function of reducing magnetic coupling of an RF coil with a gradient magnetic coil, the RF shield must be formed of a conductive material of a tiled or slitted strip-shaped thin plate. On the other hand, cooling must be performed to suppress temperature rise due to heat generation by the eddy current. Furthermore, to enlarge an opening through which a patient is inserted, the gradient magnetic coil, the RF coil, and the RF shield, which are located in a static field magnet and have roughly concentrically cylindrical shapes, are required to be reduced in thickness. To solve the above problem, the present invention provides a structure, where an RF shield, which is obtained by forming a tiled or slitted thin-plate conductive material into a sheet, is adhered or attached to an inner cylindrical surface of the gradient magnetic coil, where the RF shield is configured to be adhered or attached to a region including the vicinity of each of turn centers of an X-gradient magnetic coil pattern and a Y-gradient magnetic coil pattern, or is adhered or attached along a pattern on or a slit in the thin plate conductive material of the RF shield.

9 Claims, 6 Drawing Sheets

MAGNETIC RESONANCE IMAGING APPARATUS

CROSS-REFERENCE TO RELATED APPLICATION

This application claims priority to Japanese Patent Application No. 2022-140052 filed on Sep. 2, 2022, the entire contents of which are incorporated by reference herein.

BACKGROUND OF THE INVENTION

The present invention relates to a configuration of a radio frequency (hereinafter referred to as RF) shield, which is attached to an inner surface of a gradient magnetic coil to block magnetic coupling of the gradient magnetic coil with a radio-frequency magnetic field caused by an RF coil, in a magnetic resonance imaging apparatus.

The magnetic resonance imaging apparatus (hereinafter referred to as MRI apparatus), which acquires a cross-sectional image showing physical and chemical properties of a subject using a nuclear magnetic resonance phenomenon occurring when the subject is placed in a uniform static magnetic field and irradiated with a radio-frequency pulse, is specifically used for medical purposes.

The MRI apparatus mainly includes a magnet device that generates a uniform static magnetic field in an imaging space into which a subject is inserted, a gradient magnetic coil that generates a spatially gradient magnetic field in a pulsed manner to add positional information to the imaging space, an RF coil that applies a radio-frequency pulse to the subject, a receiving coil that receives a magnetic resonance signal from the subject, and a computer system that processes the received signal and displays an image.

A technique for improving performance of the MRI apparatus mainly includes increasing strength of the static magnetic field generated by the magnet device. Since a stronger static magnetic field provides a clearer image, the MRI apparatus is in continuous development to increase strength of the magnetic field. With the gradient magnetic coil, increasing strength of the generated gradient magnetic field and decreasing a pulse interval are developing to improve image quality and shorten imaging time. The RF coil induces a magnetic resonance phenomenon of nuclear spins and acquires a magnetic resonance signal in a form of an electromagnetic wave. To obtain a clear image, therefore, it is required to increase a magnetic resonance signal-to-noise ratio (SN ratio) by irradiating the subject in uniform distribution with a radio-frequency electromagnetic field having a frequency determined by static magnetic field strength.

In a typical horizontal-field-type MRI apparatus, the gradient magnetic coil is installed in a roughly concentrically circular shape on the inner circumferential side of the static field magnet as a roughly cylindrical magnet device. Furthermore, the RF coil also has a roughly concentrically cylindrical shape, and is installed on the inner circumferential side of the gradient magnetic coil and roughly coaxially with the static field magnet and the gradient magnetic coil.

The electromagnetic field generated by applying to the RF coil a current with a frequency determined by the static magnetic field strength is not only applied to the subject, but magnetically coupled to the gradient magnetic coil located on the outer circumferential side of the RF coil. An RF shield is therefore installed between the RF coil and the gradient magnetic coil to prevent the electromagnetic field generated by the RF coil from leaking to the gradient magnetic coil side. The RF shield also has a cylindrical shape roughly concentric with the RF coil, and is, in the MRI apparatus, typically made of a thin-plate non-magnetic conductive material such as copper, aluminum, or stainless steel.

Although the gradient magnetic coil generates a pulsed gradient magnetic field in the imaging space where the subject is placed, the RF shield, which is located between the gradient magnetic coil and the subject and made of a conductive thin plate material, receives the gradient magnetic field pulse and thus generates eddy current. Such eddy current generates Joule heat that causes temperature rise of the RF shield.

In recent MRI apparatuses, high-speed imaging methods typified by Echo Planar Imaging (EPI) tend to be used frequently, and such high-speed imaging methods are enabled by quickly starting and falling a high-intensity gradient magnetic field pulse many times. Hence, the eddy current generated by the RF shield also tends to increase, and it is a challenge to suppress an increase in temperature rise due to the eddy current heat generation.

In the past, as a technique for reducing the eddy current heat generation by the RF shield due to the gradient magnetic field, there is known a method for reducing the amount of generated eddy current by making the RF shield thin plate to have slits or a tiled pattern as described in Japanese Examined Patent Application Publication No. Hei 3(1991)-050543. In this technique, since frequency (several kilohertz) of the gradient magnetic field pulse is lower than frequency (tens to hundreds of megahertz) of the radio-frequency electromagnetic field generated by the RF coil, the RF shield is formed to have a low impedance for the radio-frequency electromagnetic field and a high impedance for the gradient magnetic field. However, increasing the number of slits or tile divisions also increases resistance to a radio-frequency electromagnetic field and thus reduces the effect of the RF shield. In this technique, therefore, generation of the eddy current must be allowed to the extent that the effect of the RF shield is not reduced.

As a technique for suppressing temperature rise due to heat generation by the RF shield, a measure may be taken, for example, a cooling structure using water cooling or air cooling may be provided as disclosed in Japanese Unexamined Patent Application Publication No. 2006-116300. On the other hand, in recent MRI apparatuses, a large opening tends to be provided such that a patient under imaging feels no sense of occlusion. Hence, the gradient magnetic coil, the RF coil, and the RF shield have been increasingly reduced in thickness while being cylindrically concentric with the static field magnet, and a cooling structure and the like are desirably simplified.

SUMMARY OF THE INVENTION

As described in Japanese Examined Patent Application Publication No. Hei 3(1991)-050543, the RF shield must be formed of a conductive material of a tiled or slitted strip-shaped thin plate to suppress generation of the eddy current caused by the gradient magnetic field while having a function of reducing magnetic coupling of the RF coil with the gradient magnetic coil. On the other hand, as described in Japanese Unexamined Patent Application Publication No. 2006-116300, cooling must be performed to suppress temperature rise due to eddy current heat generation. Furthermore, the gradient magnetic coil, the RF coil, and the RF shield, which have roughly concentrically cylindrical shapes, in the static field magnet, are each required to be reduced in thickness in order to enlarge the opening through which a patient is inserted.

An object of the invention, which has been made in light of such circumstances, is to constitute an MRI apparatus, in which the RF shield is attached to the vicinity of the turn center, having a strong gradient magnetic field, of a gradient magnetic coil on the inner circumferential surface of the gradient magnetic coil to reduce thermal resistance to the gradient magnetic coil, so that temperature rise of the RF shield can be reduced without a dedicated water-cooled or air-cooled cooling structure.

To achieve the object, the invention provides an MRI apparatus that comprises a magnetic pole generating a static magnetic field in an imaging space, a gradient magnetic coil generating a dynamic magnetic field with linear magnetic field strength with respect to a position in the imaging space, a radio-frequency coil generating a radio-frequency magnetic field in the imaging space, and an RF shield located between the gradient magnetic coil and the radio-frequency coil and reducing electrical coupling of the radio-frequency electromagnetic field with the gradient magnetic coil. In the MRI apparatus, the RF shield is installed so as to be adhered or attached to a surface of the gradient magnetic coil and an adhesion or attachment position corresponds to a region near the turn center of a winding of an X- or Y-gradient magnetic coil conductor forming the gradient magnetic coil.

The MRI apparatus according to the RF shield installation method of the invention is capable of suppressing temperature rise caused by heat generation by the eddy current generated by the RF shield due to energization of the gradient magnetic coil, and thus is capable of suppressing temperature rise of the RF shield with no additional cooling structure, leading to thickness reduction. As a result, an MRI apparatus having a large diameter can be achieved.

DETAILED DESCRIPTION OF THE PREFERRED EMBODIMENTS

Some examples of the invention are now described with reference to the drawings.

Figure 2:
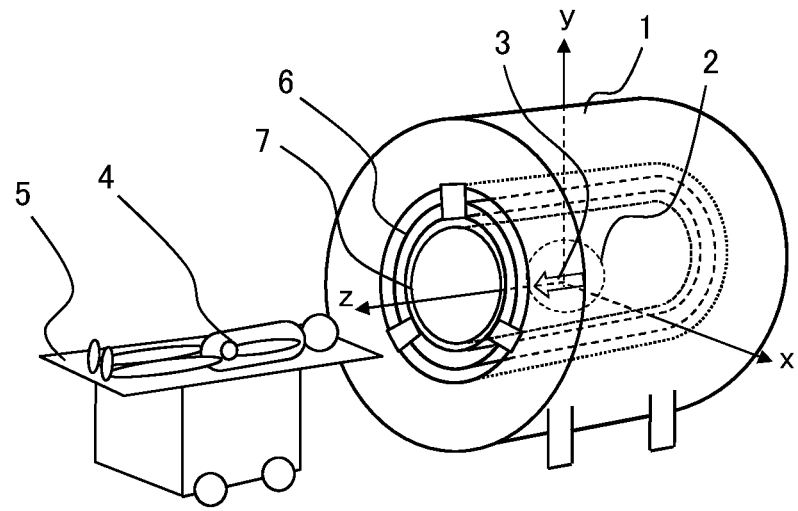
FIG. 2 is a schematic external perspective view of a horizontal-magnetic-field-type MRI apparatus of the first example.

As illustrated in FIG. 2, a typical horizontal-magnetic-field-type MRI apparatus has a cylindrical magnetic pole 1 including a superconducting coil, and generates a static magnetic field in an imaging space 2 in a direction indicated by an arrow 3. A subject 4 is carried into the imaging space 2 by a movable bed 5 for image acquisition. Such an MRI apparatus has a gradient magnetic coil 6 and an RF coil 7, which are concentrically cylindrical, inside the magnetic pole 1 that mainly uses a superconducting coil and generates a static magnetic field, and the coils 6 and 7 are normal conducting coils that respectively adds positional information for image acquisition, and induces magnetic resonance and acquires a signal.

The RF shield is located between the gradient magnetic coil 6 and the RF coil 7 and is installed so as to be adhered or attached with a double-sided tape to the inner surface of the gradient magnetic coil 6. These are covered with an undepicted cover together with the magnetic pole. While not shown, the MRI apparatus has other main components, such as a power supply unit that supplies an electric current to each of the normal conducting coils such as the gradient magnetic coil and the RF coil, a water-cooling or air-cooling device for cooling the normal conducting coils and the power supply unit, and a computer system for operation and image display.

Figure 3:
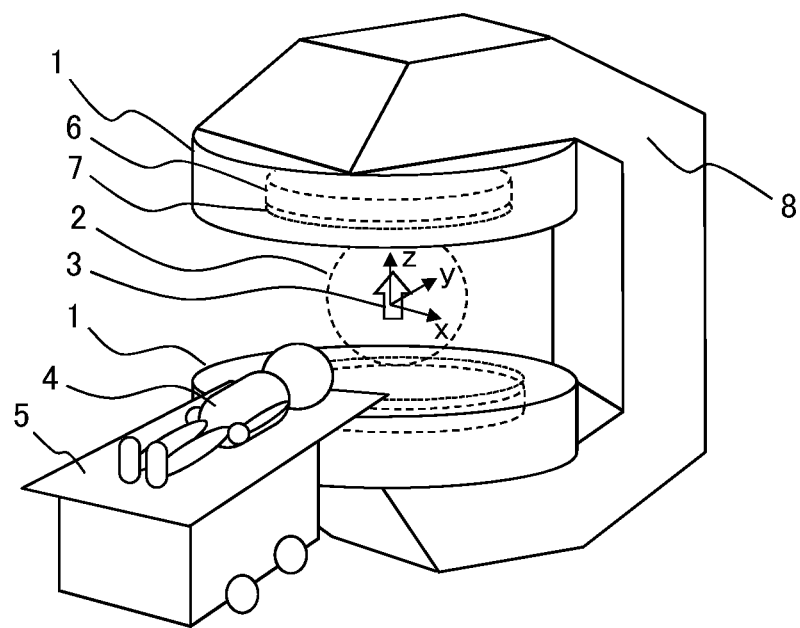
FIG. 3 is a schematic external perspective view illustrating another type of MRI apparatus of the first example.

FIG. 3 illustrates a configuration example of another typical type of the MRI apparatus, i.e., an MRI apparatus called an open type. Disc-shaped upper and lower magnetic poles 1 for generating a static magnetic field are arranged above and below an imaging space 2, and a static magnetic field is generated in the direction of an arrow 3 in the imaging space 2. A subject 4 is carried to the imaging space 2 by a movable bed 5 for image acquisition in the same manner as in the case of FIG. 2.

In the open-type MRI apparatus configured in this way, portions between the upper and lower magnetic poles are supported by a structure such as a pillar, and may be connected to each other by a roughly C-shaped magnetic-material return yoke 8 as illustrated in FIG. 3 especially in case of an apparatus of which a magnetic field strength of a static magnetic field is equal to or less than 1 Tesla. In such an open-type MRI apparatus, the gradient magnetic coil 6 and the RF coil 7, each having a disc shape, are arranged above and below the imaging space 2 in the same way as the magnetic poles, and are covered with an undepicted cover together with the magnetic poles.

The RF shield also has a roughly disc shape, and is installed on the imaging-space-side surface of the gradient magnetic coil between the gradient magnetic coil and the RF coil in each of the upper and lower magnetic poles. While not shown in FIG. 3 as with the apparatus of FIG. 2, the MRI apparatus has other main components, such as a power supply unit that supplies an electric current to each of the normal conducting coils such as the gradient magnetic coil and the RF coil, and a cooling device for cooling the normal conducting coils and the power supply unit, and a computer system for operation and image display.

As illustrated in FIG. 3, the gradient magnetic field changes with time in a pulsed manner in the imaging space 2 such that a component in the direction 3 of the static magnetic field has a gradient so as to be proportional in strength to a distance from the center. The gradient magnetic coil 6 includes three sets of coils such that a gradient magnetic field can be arbitrarily generated in the three orthogonal XYZ directions of the imaging space 2, for example, assuming the direction 3 of the static magnetic field is the Z direction, where pulsed currents can be independently applied to the coils depending on a direction of the magnetic field.

Figure 4:
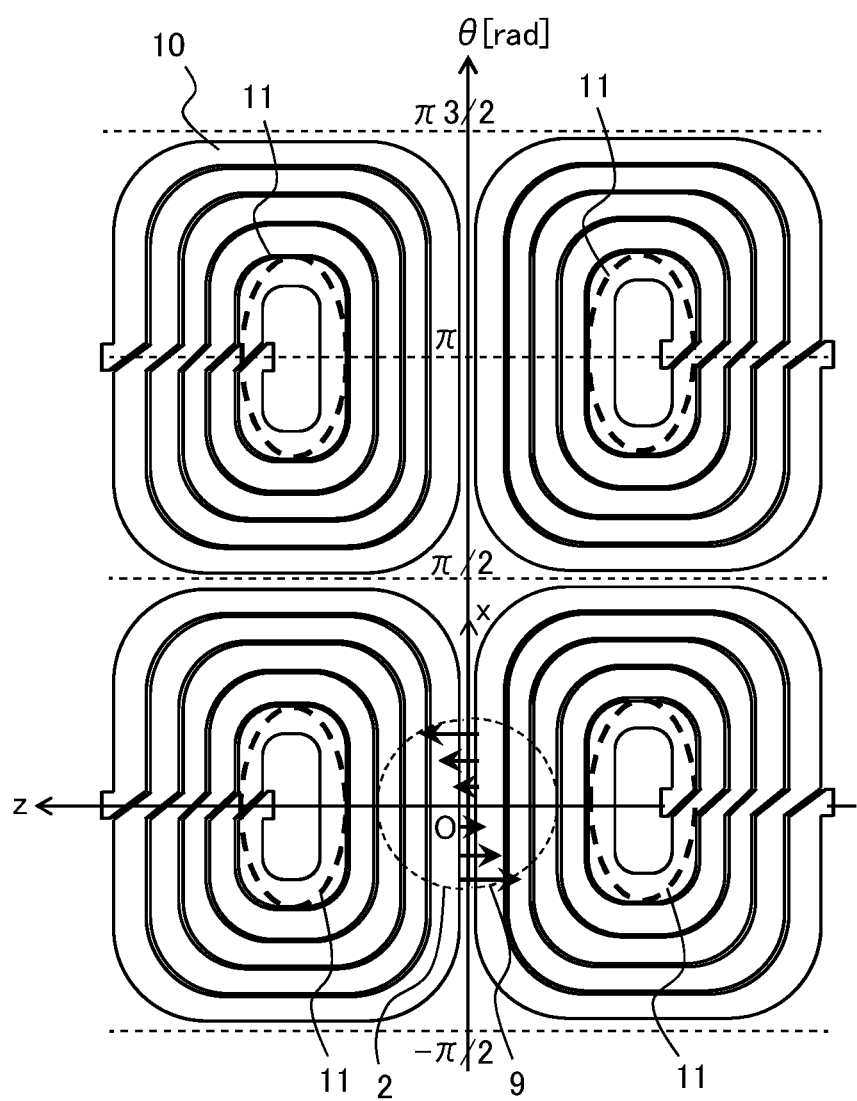
FIG. 4 is a developed view illustrating a conductor shape of an X-gradient magnetic coil of a gradient magnetic coil used in the horizontal-magnetic-field-type MRI apparatus of the first example.

While the gradient magnetic coil 6 includes the three gradient magnetic coils XYZ, the gradient magnetic coil in each direction may be configured of a main coil and a shield coil. Of these, a main coil of the X-gradient magnetic coil for generating a gradient magnetic field in the X-direction in the horizontal-magnetic-field-type MRI apparatus as illustrated in FIG. 2 includes four spiral-shaped gradient magnetic coil conductors 10 as illustrated in a developed view of FIG. 4.

The gradient magnetic coil conductor 10 is formed by winding a plate or rod of a good conductor such as, for example, copper or aluminum, or by grooving a plate material. Each of the four spiral shapes has a region 11 near the turn center, and although such a position is away from the imaging space 2 in which a gradient magnetic field 9 is generated, strength of a pulsed magnetic field, which is generated by the X-gradient magnetic coil on the inner cylindrical plane of the gradient magnetic coil, is strongest at the position. Similarly, the Y-gradient magnetic coil has a shape which is obtained by rotating the X-gradient magnetic coil by roughly degrees around the central Z axis of the coaxial cylinder.

Figure 5:
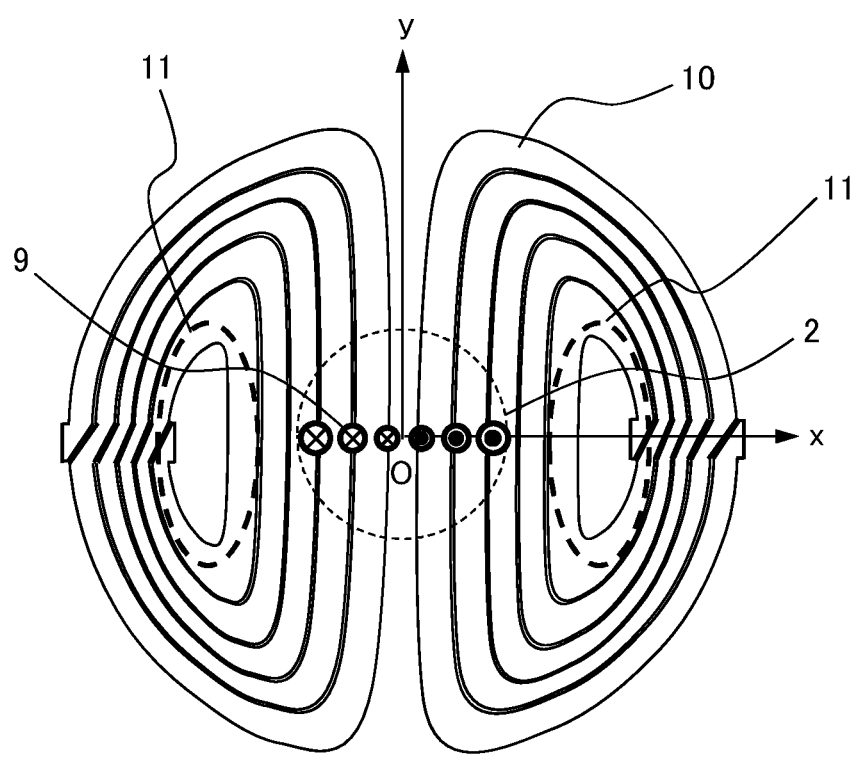
FIG. 5 is a plan view illustrating a conductor shape of an X-gradient magnetic coil of the gradient magnetic coil used in an open-type MRI apparatus according to the first example.

FIG. 5 illustrates a configuration example of a conductor shape of the X-gradient magnetic coil in the open-type MRI apparatus as illustrated in FIG. 3. FIG. 5 shows the conductor 10 of the X-gradient magnetic coil installed on the lower magnetic pole of the upper and lower magnetic poles of the static field magnet. A direction of the static magnetic field is vertical to the paper surface, and the X-gradient magnetic coil generates a pulsed magnetic field in which the magnetic field strength of the Z direction component is roughly proportional to a position of X from the center in the imaging space 2 located in the middle of the upper and lower magnetic poles in the Z direction.

The gradient magnetic coil conductor 10 is formed by winding a copper plate or copper wire, or by grooving a flat plate, as with the horizontal-magnetic-field-type MRI apparatus. As with the horizontal-magnetic-field-type MRI apparatus, on the surface of the gradient magnetic coil, strength of the pulsed magnetic field generated by the gradient magnetic coil is strongest in a region 11 near the turn center outside the imaging space 2. The open-type MRI apparatus has the turn center regions 11 at two respective locations on the surfaces of the gradient magnetic coils installed on the upper and lower magnetic pole faces with respect to one gradient magnetic field axis. The Y-gradient magnetic coil has a shape obtained by rotating the X-gradient magnetic coil by roughly 90 degrees around the Z axis.

Figure 1A:
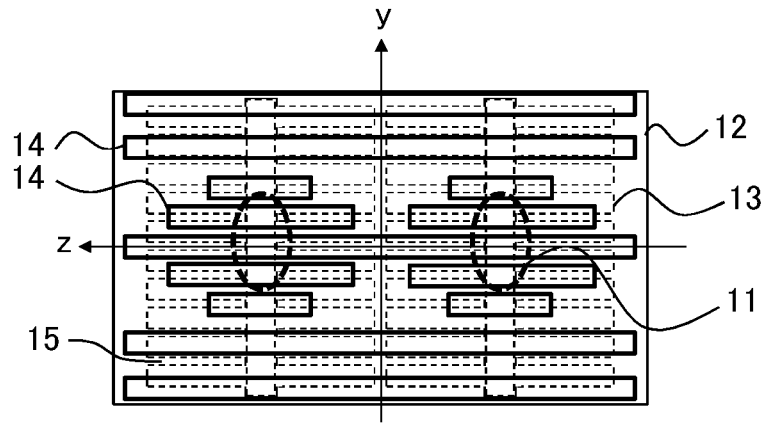
FIG. 1A to 1C illustrate one configuration example of an RF shield according to a first example.

FIG. 1A shows a partial developed view of the RF shield 12 according to the first example of the horizontal-magnetic-field-type MRI apparatus. The RF shield 12 has a thin-plate or mesh structure of a conductive material such as copper, stainless steel, or aluminum, and a shape or thickness of an RF shield pattern 13 is determined such that a radio-frequency magnetic field (hereinafter referred to as RF magnetic field) caused by the RF coil is uniformly applied to the imaging space 2, and is less magnetically coupled with the gradient magnetic coil. The RF shield 12 is installed on the inner surface of the gradient magnetic coil, and specifically in this example, is adhered or attached to the inner cylindrical surface of the gradient magnetic coil.

For example, an adhesive made of an epoxy resin is used for adhesion, and an acrylic adhesive tape is used for attachment. For the RF shield, although the conductive material may be directly adhered or attached to the inner surface of the gradient magnetic coil, when the RF shield is patterned to reduce eddy current generation by the gradient magnetic field, for example, a conductive material pattern is integrally attached to a fiber reinforced plastic (hereinafter referred to as FRP) sheet, and such a sheet with the pattern is adhered or attached as the RF shield 12 to the inner cylindrical surface of the gradient magnetic coil, expectably leading to improvement in alignment accuracy with respect to the gradient magnetic coil.

At this time, the region 11 near the turn center of the X-gradient magnetic coil conductor is the region having nearly the maximum strength of the pulsed magnetic field generated by the X-gradient magnetic coil, where a large eddy current is generated in the RF pattern 13 of the conductive material forming the RF shield. The eddy current leads to Joule heat generation due to electrical resistance of the RF pattern, causing temperature rise of the RF shield. A measure is therefore necessary to prevent excessive temperature rise, and a cooling system using a refrigerant, such as an air cooling or water cooling system, is typically used as the measure. Alternatively, a method of limiting an energization pulse to the gradient magnetic coil may be used to prevent the excessive temperature rise.

In the first example of the invention, therefore, the RF shield 12 is adhered or attached 14 to the inner cylindrical surface of the gradient magnetic coil so as to include at least the turn center region 11 of the gradient magnetic coil conductor. As a result, heat generation due to the eddy current generated in the RF shield is reduced by being cooled by the gradient magnetic coil, thus avoiding excessive temperature rise. Since the gradient magnetic coil typically has a cooling system such as water cooling or air cooling, excessive temperature rise can be suppressed in both the gradient magnetic coil and the RF shield. Heat generation by the eddy current in the RF shield is typically $1/10$ or less of heat generation due to energization of the gradient magnetic coil, and is thus has small influence on temperature rise of the gradient magnetic coil itself in this example.

Figure 1B:
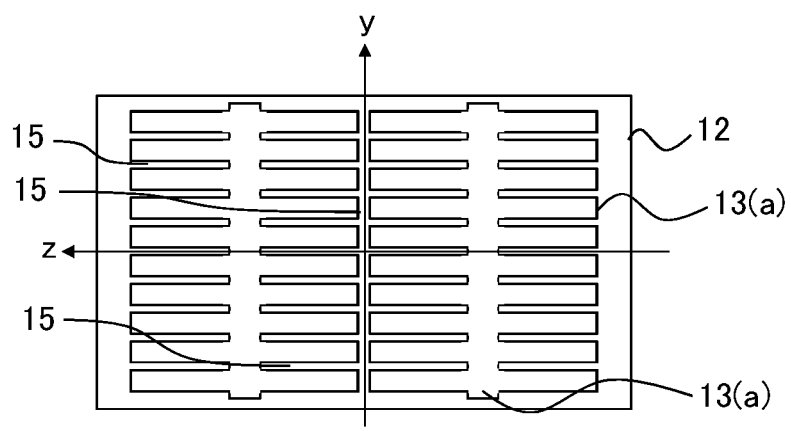
Figure 1C:
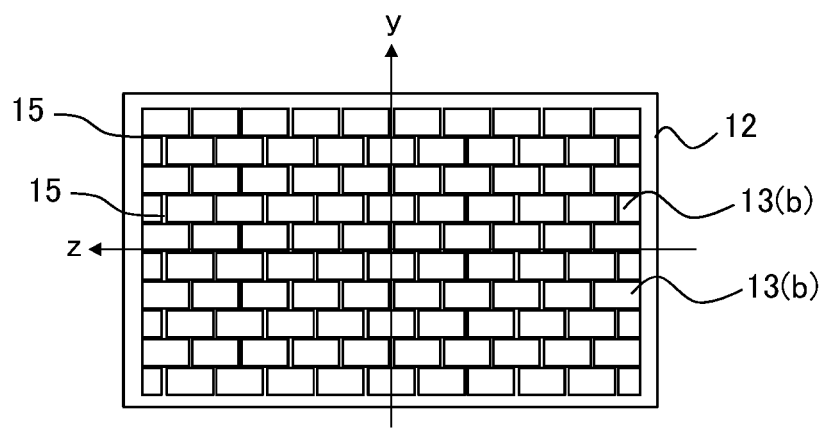

Furthermore, in this example, the pattern 13 of the conductive material forming the RF shield has a strip shape 13(a) as illustrated in FIG. 1B or a tile shape 13(b) as illustrated in FIG. 1C, and has a slit 15 structure with no pattern between the strips or tiles. The eddy current generated in the strip-shaped or tile-shaped RF shield pattern 13 has been found to have highest current density at the end portion of the strip or the tile, and the RF shield pattern 13 is adhered or attached 14 to the inner cylindrical surface of the gradient magnetic coil in alignment with an end portion of the strip or the tile to suppress temperature rise effectively.

When the entire surface of the RF shield is adhered or attached to the inner cylindrical surface of the gradient magnetic coil, the temperature rise suppression effect of the RF shield is maximized, but in such a case where the entire surface of the RF shield is adhered or attached, the RF shield may be misaligned with the RF coil during installation, or wrinkles may occur in case of a thin-film RF shield. If the RF shield peels off during use, peeling over a wide area causes temperature rise.

Experimental and analytical investigations have shown that if roughly 30% or more of area of the RF shield is adhered or attached 14 to the inner surface of the gradient magnetic coil, the temperature rise suppression effect is comparable to that of the full surface attachment of the RF shield even during imaging by Echo Planar Imaging (EPI), where the RF shield considered to generate a large amount of heat due to the gradient magnetic field.

In a horizontal-magnetic-field-type MRI apparatus with an actual static magnetic field strength of 1.5 Tesla, an RF shield, which was formed by attaching a strip-shaped RF shield pattern made of copper with a thickness of roughly 20 μm and a width of roughly 40 mm to each of the front and back surfaces of a resin sheet with a thickness of roughly 25 μm, was attached to the inner cylindrical surface of a gradient magnetic coil via a double-sided tape, and imaging by Echo Planar Imaging (EPI) was performed. As a result, it was found that the temperature rise of the RF shield was 40 degrees or less when attaching area of the double-sided tape was 15% or more of the surface area of the RF shield.

On the other hand, through a temperature rise analysis on the same system, it was found that a coefficient of heat transfer from the RF shield to the gradient magnetic coil in a portion with no double-sided tape was roughly 0.2 times that of a portion with the double-sided tape.

Hence, in the case of heat insulation where there is no heat transfer in the area with no double-sided tape, considering 15% of the surface area of the RF shield, i.e., the area where the double-sided tape is attached in the above experiment, and the heat transfer coefficient at a rate of 0.2 times of the area of 85%, i.e., the area where no double-sided tape is attached, according to the experimental and analytical results, 15+85×0.2=15+17=32%, i.e., roughly ⅓ of the RF shield area should be adhered or attached with a double-sided tape to the gradient magnetic coil surface.

In this way, adhering or attaching 14 the RF shield surface partially rather than wholly to the inner cylindrical surface of the gradient magnetic coil prevents misalignment due to wrinkles or lifting during installation or due to difference in thermal expansion from the gradient magnetic coil, so that it can be expected to improve installation accuracy with respect to a position of the gradient magnetic coil conductor and to suppress a decrease in irradiation efficiency of a radio-frequency electromagnetic field and suppress local heat generation of the RF shield. In addition, compared to the case where the RF shield is molded with resin together with the gradient magnetic coil, the positional accuracy with respect to the gradient magnetic coil conductor is improved, and the RF shield can be replaced easily after long-term use.

Second Example

Figure 6:
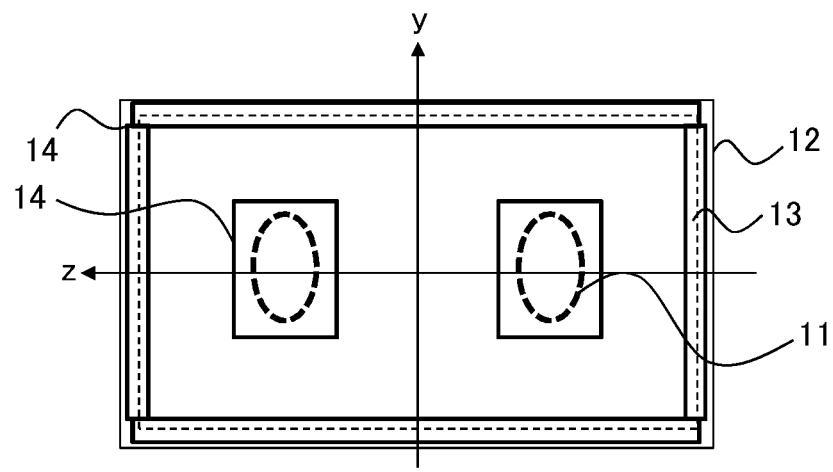
FIG. 6 is a partially developed view illustrating an adhesion or attachment position of an RF shield to the inner cylindrical surface of a gradient magnetic coil, the RF shield being used in an MRI apparatus according to a second example.

FIG. 6 illustrates a method for adhering or attaching the RF shield 12 to the inner cylindrical surface of the gradient magnetic coil, according to a second example. In this example, the RF shield 12 is adhered or attached 14 to the inner cylindrical surface of the gradient magnetic coil so as to cover the vicinity of the turn center region of each gradient magnetic coil conductor. This example is preferable for the RF shield with a mesh-shaped conductive member. When the conductive member of the RF shield has a sheet shape, only end portions of the RF shield 12 and the region near the turn center of each gradient magnetic coil conductor should be adhered or attached 14. According to this example, accuracy of the attachment position of the RF shield is improved, and the number of attachment points is decreased.

Third Example

Figure 7:
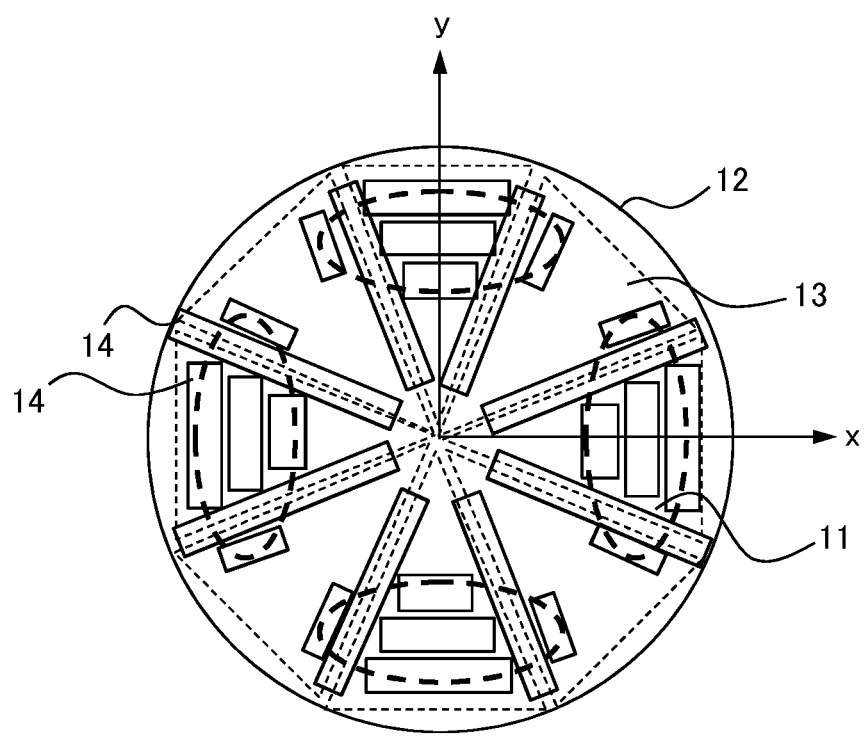
FIG. 7 is a partially developed view illustrating an adhesion or attachment position of an RF shield to the surface of a gradient magnetic coil, the RF shield being used in an open-type MRI apparatus according to a third example.

FIG. 7 illustrates a method for adhering or attaching the RF shield 12 to a surface of the gradient magnetic coil, according to a third example. This example shows an installation form of the RF shield 12 for the open-type MRI apparatus. In this example, the RF shield 12 has a disc shape, and there are a total of four regions 11 near the turn centers of X-axis gradient magnetic coil conductors and Y-axis gradient magnetic coil conductors on one of the upper and lower magnetic poles, and thus the corresponding portions and the end portions of the RF shield pattern 13 are adhered or attached 14 to the surface of the gradient magnetic coil on an imaging space surface side.

According to this example, not only in the horizontal-magnetic-field-type MRI apparatus but also in the open-type MRI apparatus, temperature rise due to heat generation by the eddy current generated in the RF shield is suppressed during energization of the gradient magnetic coil.

In the first to third examples, the shape of the RF shield 12 can be selected according to convenience of manufacturing, etc., in any of an integral structure and a divided structure, and the same effect can be expected as long as the adhesion or attachment position to the gradient magnetic coil is the same.

REFERENCE SIGNS LIST

1: Magnetic pole
2: Imaging space
3: Static magnetic field and arrow indicating direction of the static magnetic field
4: Subject
5: Movable bed
6: Gradient magnetic coil
7: RF coil
8: Return yoke
9: Gradient magnetic field
10: Gradient magnetic coil conductor
11: Region near turn center
12: RF shield
13: RF shield pattern
13(a): Strip-shaped RF shield pattern
13(b): Tile-shaped RF shield pattern
14: Adhesion or attachment position of RF shield to gradient magnetic coil
15: Slit

What is claimed is:

1. A magnetic resonance imaging apparatus, comprising:
a magnetic pole generating a static magnetic field in an imaging space;
a gradient magnetic coil generating a dynamic magnetic field with linear magnetic field strength with respect to a position in the imaging space;
a radio frequency coil generating a radio-frequency magnetic field in the imaging space; and
a radio frequency (RF) shield located between the gradient magnetic coil and the radio-frequency coil and reducing electromagnetic coupling of the radio-frequency magnetic field with the gradient magnetic coil,
wherein the RF shield is installed so as to be adhered or attached to a surface of the gradient magnetic coil, and an adhesion or attachment position corresponds to a region near the turn center of a winding of an X- or Y-gradient magnetic coil conductor forming the gradient magnetic coil.

2. The magnetic resonance imaging apparatus according to claim 1, wherein the RF shield is formed by attaching a pattern of a strip-shaped thin-film conductive material to a sheet-shaped member formed of an insulating material, and is adhered or attached to the gradient magnetic coil at an end of the pattern of the conductive material forming the RF shield or at a position along a groove between the patterns.

3. The magnetic resonance imaging apparatus according to claim 2, wherein at least one-third of area of the RF shield formed in the sheet shape is adhered or attached to the gradient magnetic coil.

4. The magnetic resonance imaging apparatus according to claim 3, wherein the magnetic pole, the gradient magnetic coil, the radio-frequency coil, and the RF shield have roughly concentrically cylindrical shapes and are located on a roughly common axis including the imaging space, and the RF shield is adhered or attached to an inner cylindrical surface of the gradient magnetic coil.

5. The magnetic resonance imaging apparatus according to claim 3, wherein the magnetic pole, the gradient magnetic coil, the radio-frequency coil, and the RF shield each have a rough shape of a pair of discs opposed across the imaging space to each other, and the RF shield is adhered or attached to a surface on a side near the imaging space of the gradient magnetic coil.

6. The magnetic resonance imaging apparatus according to claim 2, wherein the magnetic pole, the gradient magnetic coil, the radio-frequency coil, and the RF shield have roughly concentrically cylindrical shapes and are located on a roughly common axis including the imaging space, and the RF shield is adhered or attached to an inner cylindrical surface of the gradient magnetic coil.

7. The magnetic resonance imaging apparatus according to claim 2, wherein the magnetic pole, the gradient magnetic coil, the radio-frequency coil, and the RF shield each have a rough shape of a pair of discs opposed across the imaging space to each other, and the RF shield is adhered or attached to a surface on a side near the imaging space of the gradient magnetic coil.

8. The magnetic resonance imaging apparatus according to claim 1, wherein the magnetic pole, the gradient magnetic coil, the radio-frequency coil, and the RF shield have roughly concentrically cylindrical shapes and are located on a roughly common axis including the imaging space, and the RF shield is adhered or attached to an inner cylindrical surface of the gradient magnetic coil.

9. The magnetic resonance imaging apparatus according to claim 1, wherein the magnetic pole, the gradient magnetic coil, the radio-frequency coil, and the RF shield each have a rough shape of a pair of discs opposed across the imaging space to each other, and the RF shield is adhered or attached to a surface on a side near the imaging space of the gradient magnetic coil.

* * * * *